United States Patent
Luo et al.

(10) Patent No.: US 8,037,397 B2
(45) Date of Patent: Oct. 11, 2011

(54) METHOD FOR RECOVERING A LOST DATA UNIT

(75) Inventors: Zhong Luo, Shenzhen (CN); Jing Wang, Shenzhen (CN); Da Al, Shenzhen (CN); Jie Jia, Shenzhen (CN); Yilin Chang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 897 days.

(21) Appl. No.: 11/574,272

(22) PCT Filed: Aug. 9, 2005

(86) PCT No.: PCT/CN2005/001218
§ 371 (c)(1),
(2), (4) Date: May 23, 2007

(87) PCT Pub. No.: WO2006/021141
PCT Pub. Date: Mar. 2, 2006

(65) Prior Publication Data
US 2008/0052605 A1 Feb. 28, 2008

(30) Foreign Application Priority Data
Aug. 24, 2004 (CN) .......................... 2004 1 0057126

(51) Int. Cl.
*G06F 11/00* (2006.01)
(52) U.S. Cl. ...................................... 714/799
(58) Field of Classification Search .................. 714/799
See application file for complete search history.

(56) References Cited

U.S. PATENT DOCUMENTS
6,697,996 B2 * 2/2004 Chethik ........................ 714/804
(Continued)

FOREIGN PATENT DOCUMENTS
JP 8286844 11/1996
(Continued)

OTHER PUBLICATIONS
Adam H. Li, et al: "Generic Uneven Level Protection Algorithm for Multimedia Data Transmission over Packet-Switched Networks", Computer Communications and Networks, 2001. Proceedings, Tenth International Conference on Oct. 15-17, 2001, Piscataway, NJ, USA, IEEE, pp. 340-346 XP010562115.
(Continued)

*Primary Examiner* — Scott Baderman
*Assistant Examiner* — Enam Ahmed
(74) *Attorney, Agent, or Firm* — Finnegan, Henderson, Farabow, Garrett & Dunner LLP

(57) ABSTRACT

The present invention discloses a method for recovering a lost data unit, the method including: partitioning data to be transmitted into one or more data units, sorting the data units according to importance levels of the data units, and determining a check rule for the one or more data units, performing, by a transmitting end, a calculation on the sorted data units according to a predetermined algorithm depending on the check rule, to generate one or more corresponding check units; transmitting, by the transmitting end, the one or more data units to a receiving end in a sorted order, and transmitting the corresponding check units to the receiving end; recovering, by the receiving end, a lost data unit according to the receiving data units and check units as well as the check rule. With the method, the loss-preventative capability of the data units may be improved.

13 Claims, 3 Drawing Sheets

U.S. PATENT DOCUMENTS

| | | | |
|---|---|---|---|
| 7,533,330 B2 * | 5/2009 | Anderson et al. | 714/799 |
| 2002/0146074 A1 * | 10/2002 | Ariel et al. | 375/240.27 |
| 2004/0225940 A1 * | 11/2004 | Kerr et al. | 714/752 |

FOREIGN PATENT DOCUMENTS

| | | |
|---|---|---|
| KR | 2004 0044218 | 5/2004 |
| WO | WO03/ 069918 | 8/2003 |

OTHER PUBLICATIONS

Imed Bouazizi, et al: "Distortion-optimized FEC for Unequal Error Protection in MPEG-4 Video Delivery", Computers and Communications, 2004. Proceedings. ISCC 2004. Ninth International Symposium on Alexandria, Egypt Jun. 28-Jul. 1, 2004, Piscataway, NJ, USA, IEEE, vol. 2, pp. 615-620, XP010742107.

Djamel Ihidoussene, et al: "An Unequal Error Protection using Reed-Solomon Codes for Real-Time MPEG Video Stream", High Speed Networks and Multimedia Communications 5th IEEE International Conference on Jul. 3-5, 2002, Piscataway, NJ, USA, IEEE, pp. 254-258, XP010603034.

Mitsuo Hayasaka, et al: "Packet/Cell Loss Recovery Using Variable FEC Matrix for Real Time Transport Services over Best Effort Networks", Communications, 2003. APCC 2003. The 9th Asia-Pacific Conference on Sep. 21-24, 2003, Piscataway, NJ, USA, IEEE, vol. 3, pp. 1119-1123, XP010687977.

J. Rosenberg, et al: "An RTP Payload Format for Generic Forward Error Correction" Internet Citation, (Online) Dec. 1, 1999 , XP002186938 Retrieved from the Internet: URL:www.ietf.org>.

Jill M. Boyce; "Packet loss resilient transmission of MPEG video over the Internet-Principles, Protocols, and Architecture" Signal Processing. Image Communication, Elsevier Science Publishers, Amsterdam, NL, vol. 15, No. 1-2, Sep. 1999, pp. 7-24, XP004180635.

European Search Report dated Jun. 30, 2008; Application No./Patent No. 05773159.8-1247 1788822 PCT/CN2005001218.

* cited by examiner

METHOD FOR RECOVERING A LOST DATA UNIT

FIELD OF THE INVENTION

The present invention relates to the field of multimedia communication technology, and particularly to a method for recovering a lost data unit.

BACKGROUND OF THE INVENTION

The multimedia communication service is a primarily developed service in the Next Generation Network (NGN), and is implemented by using the IP-based packet switched technology to transmit multimedia packets over a wired or wireless channel.

The multimedia communication service generally selects an IP (Internet Protocol) network as a bearer network for the transmission of the multimedia data. However, as a bearer network, the IP network has the disadvantage that it cannot provide a full QoS (Quality of Service) guarantee. Although some strategies have been developed to provide certain QoS for the bearer layer of the IP network, it is far from being sufficient to provide services for a carrier class network. Thus, for a multimedia communication service which utilizes the IP network as its bearer network, especially a communication service with a high real-time demand, such as the audio/video communication, a corresponding measures for QoS guarantee from the bearer layer to the application layer of the network should be established so as to ensure the accurate transmission of the multimedia data. The measures for QoS guarantee should take into account not only the problems such as multi-path and fading associated with the wireless channel, but also the problems of the multimedia packets during transmission cause by network congestion such as delay, and packet loss.

When the data packets obtained by packetizing the multimedia data are transmitted over the IP network, they may be lost due to the transmission quality of the transmission channel. Accordingly, the packet loss will lead to a decreased recovery quality of speeches or images received by the receiving end, and thereby a significant deterioration of the overall performance of the multimedia communication. So in a multimedia communication system, the resilience and correction of errors due to the packet loss is very critical for improving the quality of the multimedia communication. The common correction measures include the packet retransmission mechanism and Forward Error Correction (FEC) mechanism.

The packet retransmission mechanism means to require a transmitting end to retransmit the lost packet(s). In this way, the problem of communication quality degradation due to the packet loss can be solved effectively. However, the communication delay due to the lost packet retransmission by the transmitting end is usually intolerable for a session-based application, such as a video-conference, etc., especially for an application based on IP multicast service which is now increasing rapidly. In such a case, it is impossible to provide packet retransmission for each user to retransmit the lost packet(s). For this reason, the retransmission mechanism is generally applicable to only the multimedia communication services which have a relatively low real-time demand.

The FEC mechanism is usually applicable to the multimedia communication services with a higher real-time demand. For the multimedia communication data transmitted based on IP network, the FEC mechanism for it often utilizes the Erasure Codes to recover the lost packets effectively. The principle of the Erasure Codes is as follows:

The receiving end recovers the lost packet(s) according to the inherent redundancy between the received packets. At present, a Reed-Solomon (RS) Code is generally used as the common Erasure Code. In the case of a code rate of ½, a RS Code enables the recovery of 33% of the lost packets. However, the computational complexity is much higher when utilizing a RS Code to recover the lost packets, which limits the application of the RS Code to the services with a large amount of data.

The H.264 standard, in which many error-resilience approaches are presented, is an IP-oriented video compression codec transmission standard finally constituted in May, 2003 by the International Telecommunication Union (ITU). The RFC 2733 protocol which supports the H.264 standard and is advanced by the Internet Engineering Task Force (IETF), i.e. "An RTP Payload Format for Generic Forward Error Correction" protocol, specifies a payload format of the multimedia data encapsulated in a Real-time Transport Protocol (RTP) data packet. The RFC 2733 protocol specifies three RTP packetization approaches for the FEC mechanism. Based on these three RTP packetization approaches, the FEC algorithm is to perform an Exclusive Or (XOR) operation to RTP data packets to generate FEC check packets, wherein the format of the generated FEC check packets also follows the format of the RTP data packets; then the transmitting end transmits the RTP data packets and the generated FEC check packets to the receiving end respectively; the receiving end recovers the lost packet(s) due to the quality of the transmission channel according to the received RTP data packets and the FEC check packets.

The three RTP packetization approaches for the FEC mechanism specified in the RFC 2733 protocol are as follows:

(1) The First Scheme:

| | | | | | |
|---|---|---|---|---|---|
| a | b | c | d | e | _each letter represents one multimedia data packet following the RTP format; |
| f(a, b) | f(b, c) | f(c, d) | f(d, e) | | _each function value represents one FEC check packet; |

The meaning of the above representation is: for a sequence of multimedia data packets a, b, c, d, e . . . , a XOR function expression f( ) is used to generate the corresponding check packets. For example, if the data packets a and b are input parameters respectively, the output value f(a, b) derived from the XOR operation of the function f( ) is regarded as a check packet, i.e.:

| | |
|---|---|
| $f(a, b) = a \oplus b$ | _the check packet f(a, b) is obtained by performing XOR operation on each binary bit of the data packet a and each corresponding binary bit of the data packet b in a proper order; |

In this way, the rest may be deduced by analogy, that is, the check packets f(b, c), f(c,d), f(d, e) may be obtained respectively;

(2) The Second Scheme:

| f(a, b) | f(a, c) | f(a, b, c) | f(c, d) | f(c, e) | f(c, d, e) | _each function value represents one FEC check packet; |
|---------|---------|------------|---------|---------|------------|---------|

The process for generating each of the check packets is the same as that of the first scheme;

(3) The Thirst Scheme:

| a | b | c | d | _each variable represents one multimedia data packet following the RTP format; |
|---|---|---|---|---|
| f(a, b, c) | f(a, c, d) | f(a, b, d) | | _each value represents one FEC check packet; |

The process of generating each of the check packets is also the same as that of the first scheme.

In summary, the relationship between the RTP data packets and the FEC check packets may be described using a mathematical model of a check matrix: in which the elements of the check matrix are 0 or 1. If the element at the crossing of the mth row and the nth column is 1, it means that the mth check packet and the nth data packet are correlated (i.e. the related packets, as the parameters of the function f( ) respectively, participate in the generation of the check packet). While if the element at the crossing of the mth row and the nth column is 0, it means that the mth check packet is independent of the nth data packet.

For example, the relationship between the RTP data packets and the generated FEC check packets in the third scheme can be expressed by the following check matrix:

$$\begin{matrix} a & b & c & d \\ \begin{bmatrix} 1 & 1 & 1 & 0 \\ 1 & 0 & 1 & 1 \\ 1 & 1 & 0 & 1 \end{bmatrix} \end{matrix}$$

In the above matrix, a, b, c and d represent four data packets respectively; the first check packet f1=f(a, b, c)=a⊕b⊕c because each of the elements at the crossings of the first row with the columns in which the data packets a, b and c are located is 1. Similarly, the second check packet f2=(a, c, d)=a⊕c⊕d and the third check packet f3=f(a, b, d)=a⊕b⊕d. Each of the check packets is generated by performing an XOR operation on each corresponding bit of each of the data packets.

Also in the RFC2733 protocol, the length of the longest RTP data packet is used as a reference, zero(s) are padded at the end of the rest data packets so that the lengths of all of the data packets participating in the XOR operation may be made identical. Therefore, the length of a FEC check packet is equal to that of the longest data packet participating in generating the FEC packet.

The three RTP packetization approaches for the FEC mechanism advanced in the RFC 2733 protocol have the following characteristics respectively:

The first scheme enables the recovery of a single lost data packet with a probability of 100%, and the recovery of any two lost data packets with a probability of 94%; however it cannot recover three successively lost data packets. The redundancy of this packetization approach is 44.4%, in which:

Redundancy=the number of check packets/(the number of data packets+the number of check packets)×100%.

The characteristic of the second scheme lies in that only the check packets are transmitted while the data packets are not transmitted, and the original data packets are recovered according to the received check packets at the receiving end. The redundancy of this packetization approach is 16.7%. However, this scheme can recover only any single lost data packet as well as certain successively lost data packets, but cannot recover the data packets according to a single received check packet.

On a condition that the redundancy is 42.9%, the third scheme can recover any single lost data packets, two successively lost data packets or certain three lost data packets. The probability of completely recovering three lost data packets is 80%, however this scheme cannot recover three successively lost data packets with a probability of 100%.

For example, when the packets f(a, b, c), c and f(a, c, d) are lost at the same time, the packet c cannot be recovered; when the packets f(a, c, d), f(a, b, d) and d are lost simultaneously, the packet d cannot be recovered.

In addition, during the process of calculating and generating the check packets, the length of the longest data packet is used as the reference, zeros have to be padded at the ends of all the rest data packets such that the lengths of all the data packets participating in the XOR operations are identical, and thus the length of a generated check packet is equal to that of the longest data packet participating in generating the check packet, which by all means leads to a higher bit overhead occupied by the check packets and hence a lower data transmission efficiency.

As can be seen from the above that the packetization approaches in the RFC 2733 protocol have an insufficiency in the capability of recovering the lost data packets so that the lost packet(s) due to the quality of the transmission channel cannot be recovered efficiently, which brings about a deterioration in the overall performance of the multimedia communication to a certain extent.

SUMMARY OF THE INVENTION

The embodiments of the present invention are to provide a method for recovering a lost data unit to improve the loss-preventive capability of the data units.

The embodiments of the present invention provide a method for recovering a lost data unit. The method includes the steps of:

partitioning data to be transmitted into one or more data units, sorting the one or more data units according to importance levels of the one or more data units, and determining a check rule for the one or more data units;

performing, by a transmitting end, a calculation on the sorted one or more data units according to a predetermined algorithm depending on the check rule, to generate one or more corresponding check units;

transmitting, by the transmitting end, the one or more data units to a receiving end in a sorted order, and transmitting the corresponding check units to the receiving end;

recovering, by the receiving end, a lost data unit according to the received one or more data units and check units as well as the check rule.

The embodiments of the present invention further provide a method for recovering a lost data unit, including:

dividing a data to be transmitted into data units, sorting the data units, and determining a check rule for the data units;

generating corresponding check units, by a transmitting end, by performing a calculation on the sorted data units according to a predetermined algorithm based on the check rule;

transmitting, by the transmitting end, the data units in a sorted order to a receiving end, and transmitting the corresponding check units to the receiving end;

recovering, by the receiving end, a lost data unit according to the received data units and check units as well as the check rule.

The embodiments of the present invention further provide a data transmission system, including a transmitting device and a receiving device, wherein the transmitting device includes a device for partitioning a data to be transmitted into data units, sorting the data units, and determining a check rule for the data units; a device for generating corresponding check units by performing a calculation on the sorted data units according to a predetermined algorithm based on the check rule; a device for transmitting the data units to the receiving end in a sorted order, and transmitting the corresponding check units to the receiving end;

the receiving device includes a device for recovering a lost data unit according to the received data units and check units as well as the check rule.

In the method for recovering a lost data unit according to the embodiments of the present invention, (m−1) check units may be generated by performing calculation on m data units based on a created optimal check matrix. Furthermore, according to the different capabilities of being recovered of different data units if lost during the transmission, the data units bearing the image data with different importance levels may be sorted and transmitted in an order of the capability of being recovered, thereby the receiving end may recover the lost data unit better. As a result, the loss-preventive capability of the data units in the multimedia communication system may be improved so as to better the quality and effect of the multimedia communication.

In addition, in the method for recovering a lost data unit according to the embodiments of the present invention, the multimedia image data are partitioned into a plurality of blocks of approximately identical lengths. In this way, it is no longer necessary to pad zeros after some data units to make the lengths of all the data units the same as that of the longest data unit because zero padding leads to larger bit overhead of the transmission channel in which the check units are transmitted and hence a low transmission efficiency of the whole system. Therefore, the method according to the embodiments of the present invention improves the overall transmission efficiency of the multimedia communication system.

DETAILED DESCRIPTION OF THE EMBODIMENTS

Some technical indexes related to the method for recovering a lost data unit according to embodiments of the present invention will be described first as follows:

Assuming that a loss of a data unit is an independent event during the transmission of data units over a transmission channel, if the channel loss rate is Pc, and there are $C_m^n$ different combinations when n data units among m data units are lost, the probability that n data units among the m data units are lost is:

$$p(m, n) = C_m^n p_c^n \cdot (1-p_c)^{m-n}$$

In all the combinations when n data units are lost, the number of the combinations including packet i is $C_{m-1}^{n-1}$, so the probability that the lost n data units include the ith data unit is:

$$p_n^i = \{C_{m-1}^{n-1}/C_m^n | n=1,2,\ldots m\}$$

While under the circumstance that n data units are lost simultaneously, the probability $p_i$ that the ith data unit cannot be recovered is:

$$p_i = \sum_{n=1}^{m} p_n^i \cdot p(m, n) \cdot c(n, i)$$

$$= \sum_{n=1}^{m} \frac{n}{m} \cdot C_m^n p_c^n \cdot (1-p_c)^{m-n} \cdot c(n, i)$$

In the above equation, c(n, i) represents a function of the parameters n and i, and the function can be determined by a check matrix.

Then the probability that the lost data units cannot be recovered may be expressed by $P_{d \times c}$:

$$P_{d \times c} = \frac{1}{m} \sum_{i=0}^{m-1} p_i$$

Wherein d represents the number of the data units, c represents the number of the 20 generated check units by calculation, then the total number of the transmitted data units is m=d+c.

In addition, in order to judge the recovery effects of different check matrixes for the lost data units as a whole, a probability $P_{total}$, n may be further used to represent the probability of a lost data unit combination that can be recovered completely.

The specific implementation process of the method for recovering a lost data unit according to the embodiments of the present invention will be described in detail with reference to the accompanying drawings and tables below.

Figure 1:
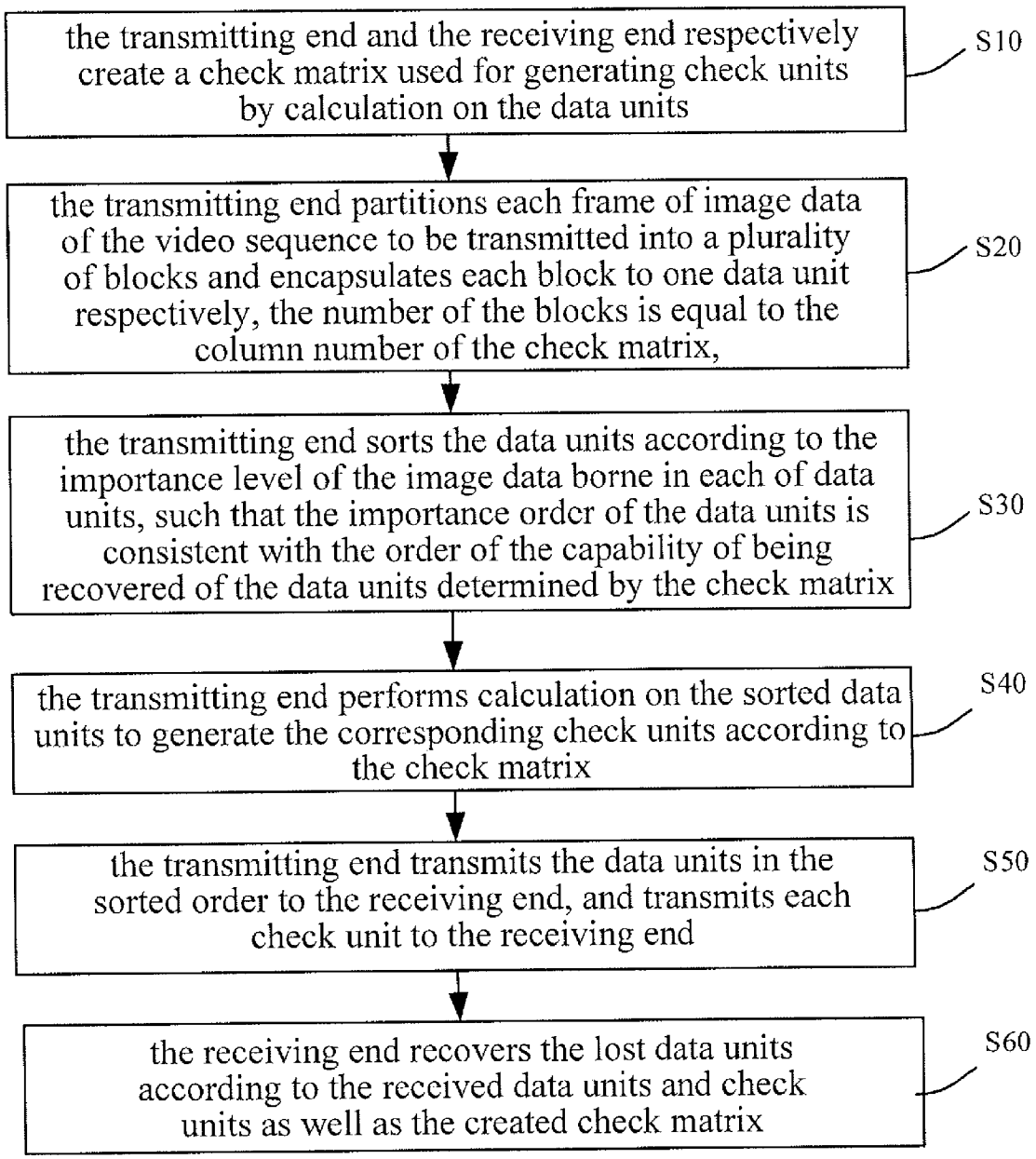
FIG. 1 is a flow diagram illustrating the implementation principle of a method for recovering a lost data unit according to an embodiment of the present invention.

Referring to FIG. 1, which is a flow diagram illustrating the implementation principle of the method for recovering a lost data unit according to an embodiment of the present invention. The method for recovering a lost data unit according to the embodiments of the present invention is mainly used for recovering the lost data units during transmission in an IP network multimedia communication system, and the specific implementation process of the method may be as follows:

Step S10, a transmitting end and a receiving end of video image data create a check matrix used for generating check units by performing calculation on the data units respectively. The created check matrix is mainly used to generate the corresponding check units by performing calculation on each of the data units. The structure of the check matrix and the element values therein determine that each of the check units is generated by different data units participating in the calculation. As a result, the capabilities of being recovered of the data units when lost may be different. That is, the specific structure of the created check matrix determines the capability of being recovered of each data unit when lost in transmission.

In the method for recovering a lost data unit according to an embodiment of the present invention, the structure of the created check matrix is of (m−1) rows and m columns, in which m is a natural number greater than 2, and the process of creating the check matrix may be as follows:

1) firstly, in the first row of the check matrix H, the second element is set to 0 and all the rest of the elements are set to 1;

2) secondly, in the first column of the check matrix H, all the elements of are set to 1;

3) then, in the second column of the check matrix H, the first element of is set to 0 and all the rest of the elements are set to 1;

4) then, all the anti-diagonal elements of a lower-right sub-matrix H* without filled elements, the dimension of which is (m−2)×(m−2) in the check matrix, are set to 1; the sub-matrix H* is in the lower-right position of the whole check matrix H, the upper-left vertex element of H* is the element on the second row and the third column of the check matrix H, and the lower-right vertex element of H* is the element on the (m−1)th row and the mth column of the check matrix H.

5) finally, all the rest elements of the sub-matrix H* are set to 0.

For example, supposing m=7, the process of creating a 6×7 (i.e. 6 rows and 7 columns) check matrix may be as follows:

① firstly, the elements of the first row are set as C1={1,0, 1 . . . ,1,1};

② secondly, the elements of the first column are set as D1={1,1,1 . . . 1,1};

③ then the elements of the second column are set as D2={0,1,1, . . . ,1,1};

④ for a sub-matrix H* with the element (2, 3) as its upper-left vertex element and the element (6, 7) as its lower-right vertex element as well as a dimension of 5×5, all the anti-diagonal elements of the sub-matrix H* are set to 1;

⑤ finally, all the rest elements of the sub-matrix H* are set to 0;

the above-mentioned process for creating the check matrix may be illustrated as follows:

$$\begin{bmatrix} 1 & 0 & 1 & 1 & 1 & 1 & 1 \\ 1 & & & & & & \\ 1 & & & & & & \\ 1 & & & & & & \\ 1 & & & & & & \\ 1 & & & & & & \end{bmatrix} \begin{bmatrix} 1 & 0 & 1 & 1 & 1 & 1 & 1 \\ & 1 & & & & & \\ & 1 & & & & & \\ & 1 & & & & & \\ & 1 & & & & & \\ & 1 & & & & & \end{bmatrix}$$
(1) (2)

$$\begin{bmatrix} 1 & 0 & 1 & 1 & 1 & 1 & 1 \\ 1 & 1 & & & & & \\ 1 & 1 & & & H^* & & \\ 1 & 1 & & & & & \\ 1 & 1 & & & & & \\ 1 & 1 & & & & & \end{bmatrix} \begin{bmatrix} 1 & 0 & 1 & 1 & 1 & 1 & 1 \\ 1 & 1 & & & & & 1 \\ 1 & 1 & & & & 1 & \\ 1 & 1 & & & 1 & & \\ 1 & 1 & & 1 & & & \\ 1 & 1 & 1 & & & & \end{bmatrix}$$
(3) (4)

$$\begin{bmatrix} 1 & 0 & 1 & 1 & 1 & 1 & 1 \\ 1 & 1 & 0 & 0 & 0 & 0 & 1 \\ 1 & 1 & 0 & 0 & 0 & 1 & 0 \\ 1 & 1 & 0 & 0 & 1 & 0 & 0 \\ 1 & 1 & 0 & 1 & 0 & 0 & 0 \\ 1 & 1 & 1 & 0 & 0 & 0 & 0 \end{bmatrix}$$
(5)

Wherein, a check matrix obtained by exchanging any two columns of the check matrix created by the above manner is also an optimal check matrix.

Many times of experiments and tests on the creating method and the structure of the check matrix according to an embodiment of the present invention show when m=5, i.e. a 5×4 check matrix is best for recovering the lost data units; while in a second place, when m=4, i.e. a 4×3 check matrix also shows a good effect for recovering the lost data units.

Step S20, the transmitting end partitions each frame of image data in the video sequence to be transmitted into multiple blocks. The number of the blocks is equal to the number of columns of the check matrix created in step S10. Then the transmitting end encapsulates each of the blocks into one data unit respectively. For example, when the number of columns of the created check matrix is 5, the transmitting end should partition each frame of image data of the video sequence to be transmitted into 5 blocks.

Wherein, the operation that the transmitting end partitioning each frame of image data of the video sequence to be transmitted into m (m is a natural number greater than 2) blocks is a data partitioning to the H.264 video image data, in which the data can be partitioned into m blocks of approximately identical sizes according to the sequence header information, Network Abstraction Layer (NAL) Unit header information, intra-frame coding information, motion vector, inter-frame coding information, and the like of the image data.

After the data partitioning of the image data, the three data partitioning blocks of a same image frame generally have different data partitioning lengths, the most important data partitioning block usually has a shorter data length, while the data block containing the AC coefficient (AC coefficient: AC=Alternating Current, represents a coefficient corresponding to the non-zero frequency components of a pixel after DCT transform) usually has the longest data length. So, partitioning each frame of the image data into blocks with approximately identical lengths based on different channel coding schemes and constituting the corresponding data units as required may reduce redundant bits during the transmission of the data units and improve the efficiencies of the channel coding and transmission.

Wherein the process of partitioning each frame of image data of the video sequence into m blocks with approximately identical lengths may include the following steps:

Each frame of Intra-frame coded frame (i.e. I frame, Intra frame) image data is partitioned into m blocks with identical lengths in a proper order. The I frame employs the IDR coding mode, the image data borne in the I frame are the most important data in the entire sequence code stream, and also the basis for recovering the overall data units, so for the I frame coded data, the whole frame of image data code stream is partitioned into 5 parts with approximately identical lengths in a proper order, and these 5 parts are put into the corresponding data units for transmission.

Each frame of predicted frame (i.e. P frame) image data or backward predicted frame (i.e. B frame) image data is partitioned into three Network Abstraction Layer Units (NALU); then the first two bytes identifying the length information of a NALU in each of the three NALUs are joined together, the rest of each NALU are also joined after the joined bytes respectively to form a large data block; then the formed large data block is partitioned, as an entirety, into m blocks with identical lengths.

In the case that the length of an I frame image data is not divisible by m, or the length of a formed large data block is not divisible by m, when divided by m, the remainder k (k<m) bytes are filled in the corresponding k data units having higher importance levels after all the data units are sorted according to the importance levels of the image data borne in them, and each data unit is filled with one remainder byte.

Figure 2:
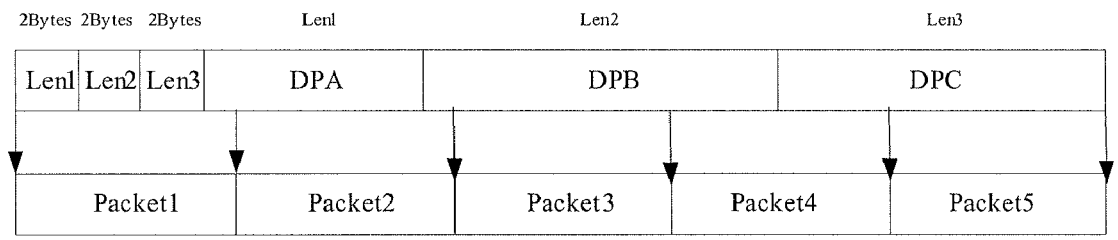
FIG. 2 is a schematic diagram illustrating a data partition of a P frame or a B frame in a method for recovering a lost data unit according to an embodiment of the present invention.

Referring to FIG. 2, which is a schematic diagram illustrating the data partitioning to a P frame or a B frame in the method for recovering the lost data units according to an embodiment of the present invention. For P frame image data and B frame image data, three NALUs will be generated after the corresponding data partitioning to each frame of image data according to the standard. The three NALUs are put into m blocks with identical length in order according to the priority of each NALU, thereby each P frame image data or each B frame image data is partitioned into blocks with identical length. As shown in FIG. 2, which is a schematic diagram illustrating the operation of partitioning each P image data or each B frame image data into 5 blocks with approximately identical lengths. The 5 blocks Packet1 . . . Packet5 are arranged from high priority to low priority, and the length of each block is the quotient obtained by exactly dividing the image data amount of the current frame by 5; if a remainder exists, the lengths of the blocks are increased in turn from the block with the highest priority. For example, if the remainder is 3 bits, the lengths of Packet1, Packet2 and Packet 3 will be respectively increased by 1 bit. In FIG. 2, It will be taken as an example that a P frame is partitioned into 3 NALUs which are DPA, DPB and DPC respectively, in which the length of DPA is represented by Len1, the length of DPB is represented by Len2 and the length of DPA is represented by Len3; the units Len1-3 identifying the lengths of the 3 data partitioning parts, i.e., 6 bytes altogether, are located in the block Packet1; the parts DPA, DPB and DPC in the frame are respectively put in the rest part of Packet1 . . . Packet5 after partitioning, thereby, the P frame image data are partitioned into 5 blocks with approximately identical lengths.

The data unit mentioned in the embodiments of the present invention is a general description; it includes not only the IP data packets but also the circuit-switched data frames, and includes any other data units with certain length and structure.

Step S30, the transmitting end sorts the data units according to the importance level of the image data borne in each of data units, such that the order of importance of the data units is consistent with the order of the capability of being recovered of the data units determined by the check matrix. The importance of different parts of compression coded video image data are different, thus the data with higher importance should be endowed with stronger loss-preventive protection capability so as to protect the data most efficiently during the transmission. So the transmitting end may sort the data units according to the importance level of the image data borne in each data unit, and the sorting result should makes the order of importance of the data units consistent with the order of the capability of being recovered of the data units determined by the check matrix.

Many times of experiments and tests on the creating method and structure of the check matrix according to the embodiments of the present invention show that when m=5, i.e. a 5×4 check matrix is best for recovering the lost data units, while for the 5 data units using a 5×4 check matrix, the data unit having the strongest capability of being recovered is the first (in the case that 4 data units are lost simultaneously), therefore the most important image data should be put into the first data unit (i.e. the No.0 data unit), and the data unit bearing the image data with the highest importance level should be arranged in the first place. For m=4, i.e. among 4 data units using a 4×3 check matrix, the capability of being recovered of the first data unit is also the strongest, so the most important data information also should be put in this data unit, and the image data with lower importance level are input in the rest of the 3 data units in order. In this case, the data unit bearing the image data with the highest importance level should be arranged in the first place. In actual fact, in any case of m>2, the data unit bearing the image data with the highest importance level should be arranged in the first place.

Step S40, the transmitting end performs calculations on the multiple of sorted data units to generate the multiple of corresponding check units according to the check matrix created in step S10. Wherein each check unit is generated by an XOR operation to the corresponding data units selected from the multiple of data units according to the element values of the corresponding row of the check matrix. For example, when calculating check units from m data units according to a $(m-1) \times m$ check matrix, the method for generating the kth ($k \leq m-1$) check unit may be: if the jth ($1 \leq j \leq m$) element of the kth row of the check matrix is 1, the jth data will participate in the XOR operation; while if this element is 0, the jth data will not participate in the XOR operation.

For example, according to the above method for creating the check matrix, assuming there are 5 data units a, b, c, d and e, then a 5×4 check matrix created for the 5 data units may be:

$$\begin{array}{ccccc} a & b & c & d & e \end{array}$$
$$\begin{bmatrix} 1 & 0 & 1 & 1 & 1 \\ 1 & 1 & 0 & 0 & 1 \\ 1 & 1 & 0 & 1 & 0 \\ 1 & 1 & 1 & 0 & 0 \end{bmatrix}$$

The corresponding 4 check units may be obtained by the corresponding XOR operations to the 5 data units according to the above-mentioned 5×4 check matrix, and the operations may be:

the first check unit selects the corresponding data units to perform the XOR operation according to the elements of the first row of the check matrix, $f1=f(a, c, d, e)=a \oplus c \oplus d \oplus e$;

the second check unit selects the corresponding data units to perform the XOR operation according to the elements of the second row of the check matrix, $f2=f(a, b, e)=a \oplus b \oplus e$;

the third check unit selects the corresponding data units to perform the XOR operation according to the elements of the third row of the check matrix, $f3=f(a, b, d)=a \oplus b \oplus d$;

the fourth check unit selects the corresponding data units to perform the XOR operation according to the elements of the fourth row of the check matrix, $f4=f(a, b, c)=a \oplus b \oplus c$;

As can be seen that for the 5 data units a, b, c, d and e, 4 corresponding check units f1, f2, f3 and f4 may be generated according to the check matrix.

Step S50, the transmitting end transmits the multiple of data units in the order of step S30 to the receiving end via the IP network transmission system, and transmits each of the check units generated in step S40 to the receiving end;

Step S60, the receiving end recovers the lost data unit(s) according to the received data units and check units, as well as the check matrix created in step S10. Accordingly, the receiving end selects the corresponding data units and check units to perform the XOR operations to recover the corresponding lost data units according to the check unit. For example, in the case of the 5×4 check matrix, the first check unit f1=f(a, c, d, e)=a⊕c⊕d⊕e;
the second check unit f2=f(a, b, e)=a⊕b⊕e;
the third check unit f3=f(a, b, d)=a⊕b⊕d;
the forth check unit f4=f(a, b, c)=a⊕b⊕c;

if the second data unit b is lost during transmission, while the four check units f1, f2, f3 and f4 are received normally, since:

f1⊕f2⊕f3⊕f4=a⊕c⊕d⊕e⊕a⊕b⊕e⊕a⊕b⊕d⊕a⊕b⊕c=b the receiving end performs the XOR operation to the four check units f1, f2, f3 and f4 bit by bit, and the lost data unit b may be recovered.

Figure 3:
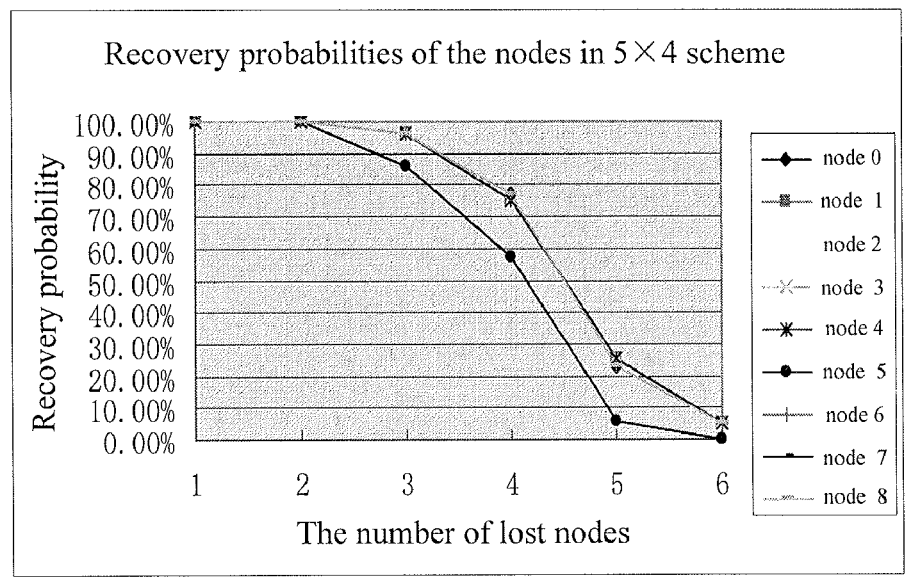
FIG. 3 is a schematic diagram illustrating the probabilities of recovering the lost data units by use of a 4×3 check matrix in a method for recovering a lost data unit according to an embodiment of the present invention.
Figure 4:
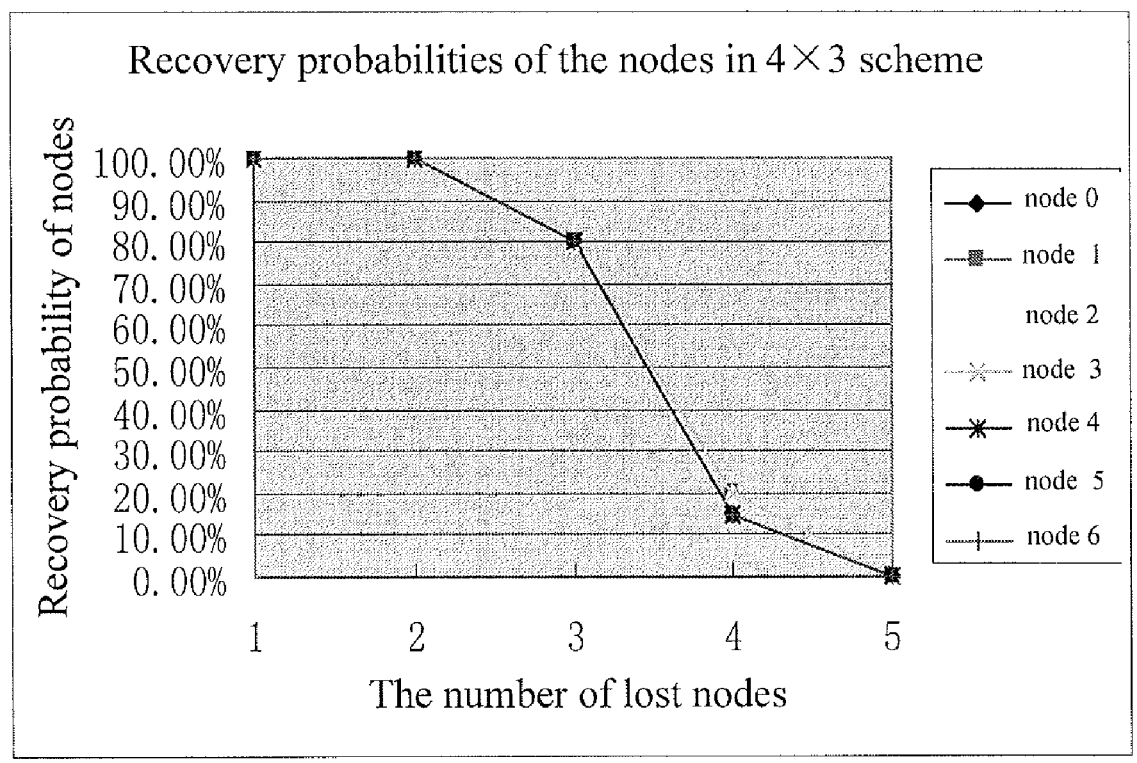
FIG. 4 is a schematic diagram illustrating the probabilities of recovering the lost data units by use of a 5×4 check matrix in a method for recovering a lost data unit according to an embodiment of the present invention.

Referring to FIG. 3 together with FIG. 4, which are schematic diagrams illustrating recovery probabilities of recovering the lost data units by use of a 4×3 check matrix and by use of a 5×4 check matrix in the method for recovering the lost data units according to embodiments of the present invention respectively. As can be seen from these two figures that the probabilities of being recovered of the data units are different because the positions of the elements in the 4×3 check matrix and in the 5×4 check matrix and the number of the data units required in generating the check units are different. Both the method of 4×3 check matrix (i.e. 4 data units are used for generate 3 check units) and the method of 5×4 check matrix (i.e. 5 data units are used for generate 4 check units) have this characteristic. As can be seen from FIG. 3 and FIG. 4 that the probability of being recovered of the data unit 5 (i.e., the node 5 in FIG. 4) in the scheme of 5×4 check matrix is most significant.

The different effects produced by the approach of 4×3 check matrix and the approach of 5×4 check matrix in the method for recovering the lost data units according to the embodiments of the present invention will be described below. Wherein the code rates and redundancies of the 4×3 approach and the 5×4 approach (code rate=1−redundancy) are shown in the following table:

|  | 4 × 3 | 5 × 4 |
|---|---|---|
| Code Rate R | 4/7 | 5/9 |
| Redundancy | 42.9% | 44.4% |

As can be seen that, compared with the 4×3 approach, the code rate of the 5×4 approach is reduced and the redundancy thereof is increased. This table shows that the stronger the loss-preventive protection for the data units of the check matrix structure is, the higher the required redundancy is, and the lower the corresponding code rate is. Thus when selecting different check matrix structures to protect the data units with different protection endeavor, it is necessary to compromise between the code rate and the redundancy.

Then, as shown in the following table, the probabilities for recovering different lost data units by use of the 4×3 approach and the 5×4 approach are compared:

|  | Number of lost data units | | | | |
|---|---|---|---|---|---|
|  | 1 | 2 | 3 | 4 | 5 |
| 4 × 3 | 100% | 100% | 80% | 0 | 0 |
| 5 × 4 | 100% | 100% | 95.24% | 69.05% | 0 |

As can be seen that, with the 4×3 approach, any single lost data unit may be recovered with a probability of 100%; any two lost data units may also be recovered with a probability of 100%; while three successively lost data units may be recovered with a probability of 80%.

With the 5×4 approach, any single lost data unit maybe recovered with a probability of 100%; any two lost data units may also be recovered with a probability of 100%; while three successively lost data units may be recovered with a probability of 95.24%; further, four successively lost data units maybe recovered with a probability of 69.05%. So the check matrix of the 5×4 approach is a preferred embodiment of the method for recovering the lost data units.

Finally, as shown in the following table, the erasure capabilities (i.e. the capability that cannot recovery the data units) of the 4×3 approach and the 5×4 approach will be compared:

|  | Packet-loss rate before erasure | | | | |
|---|---|---|---|---|---|
|  | 3% | 5% | 10% | 20% | 30% |
| $P_{4 \times 3}$ | 8.43E−05 | 3.99E−04 | 3.30E−03 | 2.68E−02 | 8.66E−02 |
| $P_{5 \times 4}$ | 4.16E−05 | 2.09E−04 | 1.98E−03 | 1.96E−02 | 7.27E−02 |
| Erasure capability ratio | 2.0 | 1.9 | 1.7 | 1.4 | 1.2 |

The above table refers to: the erasure capability values corresponding to $P_{d \times c}$ for different network packet-loss rates. For example, when the network packet-loss rate is 5%, the erasure capability of $P_{4 \times 3}$ is $3.99 \times 10^{-4}$.

In summary, compared with the prior art, the method for recovering the lost data units according to the embodiments of the present invention enables the recovery of three non-successively lost data units with a probability of 100% while the redundancy is increased by only 1.5%, and enables the recovery of three successively lost data units with a probability of 95.24%. In the case that the loss rate of the data units is high (for example, 30% of the data units are lost), the recovery performance can be improved by 20%. In addition, with the method according to the embodiments of the present invention, four successively lost data units may be recovered with a probability of 69%.

Further, in the method for recovering the lost data units according to the embodiments of the present invention, the data units are sorted according to the different importance levels of the image data borne in the data units before transmission. Although the redundancies for protecting all the data units are identical as a whole, certain important image data may be protected better.

In addition, in the method for recovering the lost data unit according to the embodiments of the present invention, each frame of image data is partitioned into the parts with approximately identical lengths. After the identical-length partitioning for each frame of image data, the redundancy information of the check units is minimized, and the transmission efficiency of the IP network transmission system can be improved.

While the present invention has been illustrated and described with reference to some embodiments, the present invention is not limited to these. Those skilled in the art should recognize that various variations and modifications can be made without departing from the spirit and scope of the present invention as defined by the accompanying claims.

What is claimed is:

1. A method for recovering a lost data unit, comprising:
partitioning data to be transmitted into one or more data units, sorting the data units according to importance levels of the data units, and determining a check matrix for the one or more data units, wherein an order of importance of the data units is consistent with an order of capabilities of being recovered of the data units determined by the check matrix;
generating one or more corresponding check units by an Exclusive OR (XOR) operation to the corresponding data units selected from the multiple data units according to the element values of the corresponding row of the check matrix;
transmitting, by the transmitting end, the one or more data units to a receiving end in a sorted order, and transmitting the corresponding check units to the receiving end;
recovering, by the receiving end, a lost data unit according to the received data units and check units as well as the check matrix.

2. The method according to claim 1, further comprising:
partitioning, by the transmitting end, the data to be transmitted into a plurality of blocks and encapsulating each of the blocks in one data unit, the number of the blocks in the one data unit being equal to a number of columns of the check matrix.

3. The method according to claim 1, wherein the check matrix is a matrix with m-1 rows and m columns, the m being a natural number greater than 2.

4. The method according to claim 3, wherein the process of generating the check matrix comprises:
setting the second element of the first row of the check matrix to 0, and all the remaining elements of the first row of the check matrix to 1;
setting all elements of the first column of the check matrix to 1;
setting the first element of the second column of the check matrix to 0, and all the remaining elements of the second column of the check matrix to 1;
setting all the anti-diagonal elements of a lower-right sub-matrix to 1, the lower-right sub-matrix having not been filled with elements and has a dimension of (m−2)×(m−2) within the check matrix;
setting all the rest of the elements of the sub-matrix to 0.

5. The method according to claim 3, wherein the m is equal to 5 or equal to 4.

6. The method according to claim 2, wherein the data is image data of a video sequence.

7. The method according to claim 6, wherein the process of partitioning the image data of the video sequence into one or more data units comprises:
partitioning each frame of intra-frame coded image data into a plurality of blocks with identical lengths;
partitioning each frame of predicted frame image data or backward predicted frame image data into three Network Abstraction Layer Units (NALU);
joining the first two bytes identifying a length information of a Network Abstraction Layer Unit (NALU) in each of the three Network Abstraction Layer Units (NALU) together, and joining the rest of each Network Abstraction Layer Unit (NALU) together to form a large data block;
partitioning, as a whole, the formed large data block into a plurality of blocks with identical lengths.

8. The method according to claim 7, further comprising:
when a length of each frame of intra-frame coded frame image data or a length of each large data block is not divisible by the number of the blocks to be partitioned, filling remainder k bytes into k data units bearing image data with higher importance levels after the sorting, wherein each of the k data units is filled with one remainder byte, and k is less than the number of the blocks to be partitioned.

9. The method according to claim 6, wherein a data unit bearing image data with the highest importance level is arranged in the first place.

10. The method according to claim 1, wherein the lost data unit is recovered by the receiving end by selecting corresponding data units and check units received and performing Exclusive Or (XOR) operations on the selected data units and check units.

11. The method according to claim 1, wherein the one or more data units are IP data packets or circuit-switched data frames.

12. The method according to claim 1, wherein the transmitting end transmits the one or more data units and check units to the receiving end over an IP network.

13. A data transmission system, comprising a transmitting device and a receiving device, wherein,
the transmitting device comprises a device for partitioning a data to be transmitted into data units, sorting the data units according to importance levels of the data units, and determining a check matrix for the data units, wherein an order of importance of the data units is consistent with an order of capabilities of being recovered of the data units determined by the check matrix; a device for generating corresponding check units by an Exclusive OR (XOR) operation to the corresponding data units selected from the multiple data units according to the element values of the corresponding row of the check matrix; a device for transmitting the data units to the receiving end in a sorted order, and transmitting the corresponding check units to the receiving end;
the receiving device comprises a device for recovering a lost data unit according to the received data units and check units as well as the check matrix.

* * * * *